US006645550B1

(12) United States Patent
Cheung et al.

(10) Patent No.: US 6,645,550 B1
(45) Date of Patent: Nov. 11, 2003

(54) METHOD OF TREATING A SUBSTRATE

(75) Inventors: Robin Cheung, Cupertino, CA (US); Yezdi Dordi, Palo Alto, CA (US); Jennifer Tseng, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/599,125

(22) Filed: Jun. 22, 2000

(51) Int. Cl.$^7$ ............... B05D 1/02; B05D 5/12; B05D 3/10; B05D 1/36
(52) U.S. Cl. .............. 427/123; 427/261; 427/287; 427/328; 427/343; 427/404; 427/405; 427/421
(58) Field of Search .................. 427/601, 123, 427/261, 287, 304, 305, 328, 343, 404, 405, 421, 437, 438, 436, 443.1; 438/760, 763

(56) References Cited

U.S. PATENT DOCUMENTS

| 2,369,620 A | | 2/1945 | Sullivan et al. ............ 117/130 |
|---|---|---|---|
| 4,232,060 A | * | 11/1980 | Mallory, Jr. ................. 427/98 |
| 4,368,223 A | * | 1/1983 | Kobayashi et al. ....... 427/443.1 |
| 4,397,812 A | | 8/1983 | Mallory, Jr. ................ 420/441 |
| 4,810,520 A | * | 3/1989 | Wu ................................ 427/8 |
| 5,147,692 A | | 9/1992 | Bengston ................... 427/438 |
| 5,248,527 A | | 9/1993 | Uchida et al. .............. 427/437 |
| 5,695,810 A | | 12/1997 | Dubin et al. .................. 427/96 |
| 5,843,538 A | * | 12/1998 | Ehrsam et al. ............. 427/601 |
| 5,904,827 A | * | 5/1999 | Reynolds .................... 205/68 |
| 5,910,340 A | | 6/1999 | Uchida et al. .............. 427/437 |
| 5,969,422 A | | 10/1999 | Ting et al. .................. 257/762 |
| 6,010,962 A | | 1/2000 | Liu et al. .................... 438/687 |
| 6,015,724 A | | 1/2000 | Yamazaki ................... 438/151 |
| 6,136,693 A | | 10/2000 | Chan et al. ................. 438/633 |
| 6,140,234 A | | 10/2000 | Uzoh et al. ................. 438/678 |
| 6,174,812 B1 | | 1/2001 | Hsiung et al. .............. 438/687 |

OTHER PUBLICATIONS

Lopatin et al., "Thin Electroless Barrier for Copper Films", Multilevel Interconnect Technology II, Proceedings of SPIE, vol. 3508, pp. 65–77, Sep. 1998.*
Lin et al. "Manufacturing of Cu/Electroless Nickel/Sn–Pb Flip Chip Solder Bumps", IEEE Transactions on Advanced Packaging, vol. 22, No. 4,pp. 575–579, Nov. 1999.
Lopatin et al. "Thin Electroless Barrier for Copper Films" Part of the SPIE Conference of Multilevel Interconnect Technology II, SPIE vol. 3508, pp. 65–77, 1998.

* cited by examiner

Primary Examiner—Michael Barr
(74) Attorney, Agent, or Firm—Moser, Patterson & Sheridan

(57) ABSTRACT

A method of treating a substrate. The method comprises forming a metal-containing layer on at least a selected portion of the substrate during a substrate cleaning process.

17 Claims, 3 Drawing Sheets

METHOD OF TREATING A SUBSTRATE

BACKGROUND OF THE DISCLOSURE

1. Field of the Invention

The invention relates to a method for substrate treatment.

2. Description of the Background Art

Copper and its alloys are increasingly being used for metal interconnects in advanced integrated circuit fabrication because they have lower resistivities compared to aluminum and do not suffer from poor electromigration. Copper can be deposited over high aspect ratio via and contact structures using metal electroplating. A typical electroplating method generally comprises vapor depositing a barrier layer over the via or contact, vapor depositing a conductive metal seed layer, e.g., copper, over the barrier layer, followed by electroplating a conductive metal over the seed layer to fill the via or contact structure. Finally, chemical mechanical polishing (CMP) can be used to define a planarized conductive interconnect feature by polishing the electroplated metal layer using a polishing fluid, which may include a chemical and an abrasive.

However, defects may be introduced into the planarized conductive layer after CMP. These defects may include, for example, particulate or chemical contamination, physical damage, discontinuity in the conductive layer, and so on. Therefore, the planarized metal layer is subjected to various post-CMP cleaning or treatment (e.g., thermal or plasma anneal) steps prior to additional processing such as subsequent deposition of a dielectric layer. However, even after post-CMP cleaning or treatment, the surface of the planarized layer may present other problems in subsequent processing—e.g., vulnerability to chemical corrosion, or failure to provide a good adhesive surface for a subsequently deposited layer such as a dielectric layer.

Therefore, there is an ongoing need for a method of post-CMP treatment of a metal layer.

SUMMARY OF THE INVENTION

The present invention generally provides a method of treating a substrate, comprising forming a metal-containing layer on the substrate during substrate cleaning. In one embodiment, a substrate is subjected to chemical mechanical polishing prior to being treated according to embodiments of the invention. During substrate cleaning following chemical mechanical polishing, the substrate is exposed to an electroless plating solution (or electrolyte) to form a metal-containing layer by electroless deposition over at least one portion of the substrate, e.g., over one or more copper features on the substrate. The electroless deposition of the metal-containing layer may be accomplished by either spraying the electroless plating solution on the substrate, or by immersing the substrate in a cleaning bath containing the electroless plating solution.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention generally provides a method of treating a substrate by integrating the formation of a metal-containing layer on a substrate during a substrate cleaning process. In one aspect of the invention, an electroless deposition is incorporated into the cleaning process to form a metal-containing layer on the substrate. In one embodiment, the substrate comprises a copper layer that has been formed on a semiconductor wafer. As an illustration, the treatment method of the invention is performed on the copper layer after the wafer has been subjected to chemical mechanical polishing (CMP).

Apparatus

Figure 1:
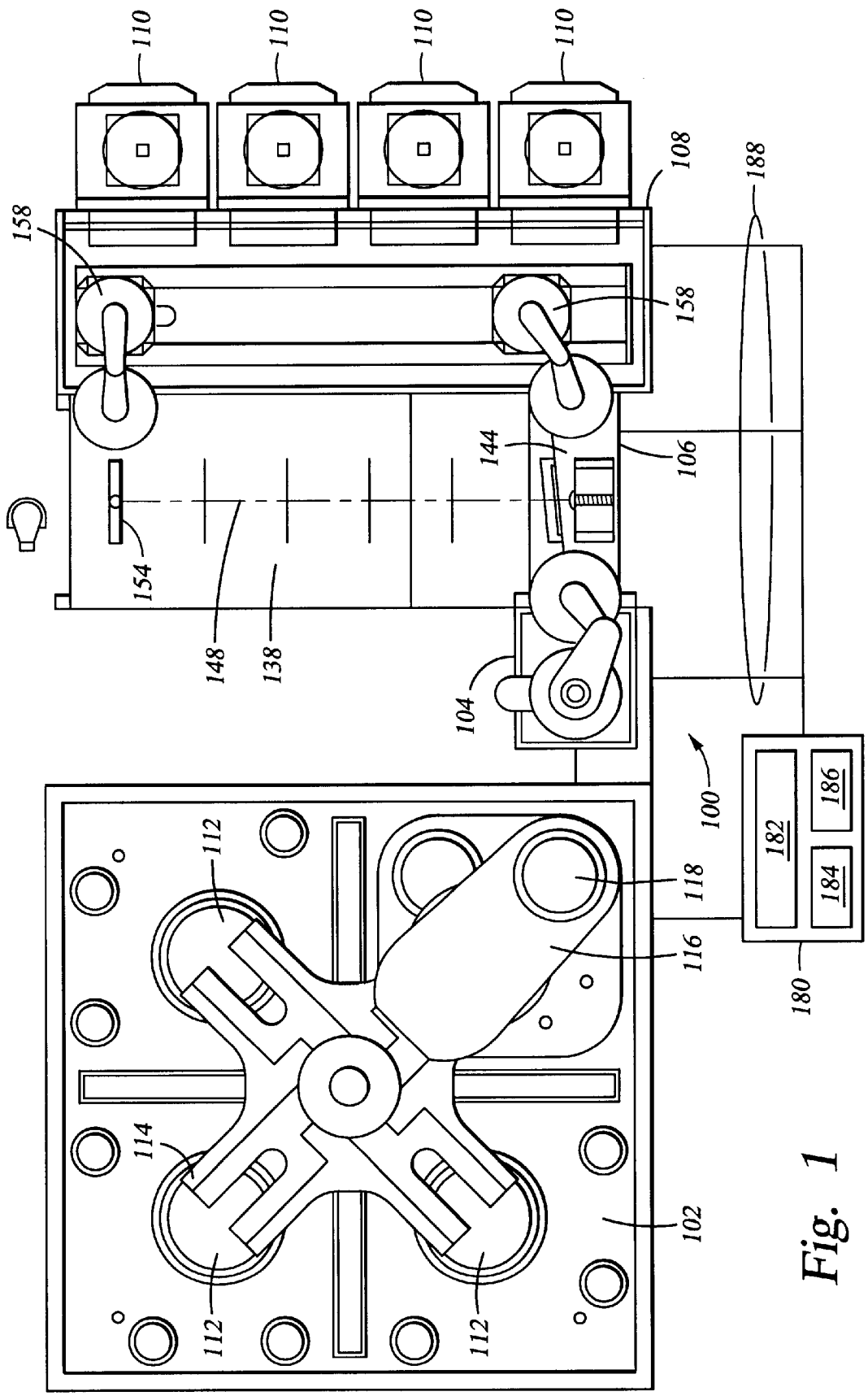
FIG. 1 depicts an apparatus suitable for practicing the present invention.

FIG. 1 illustrates a schematic diagram of an apparatus 100 suitable for practicing the treatment method of the present invention. For example, the apparatus 100 may be a Mirra Mesa™ CMP system, available commercially from Applied Materials, Inc., of Santa Clara, Calif. A description of the Mirra CMP system has been disclosed in commonly-assigned U.S. provisional patent application, entitled "Method and Apparatus For Transferring Semiconductor Wafers Using An Input Module," Ser. No. 60/139,222, filed on Jun. 15, 1999, which is incorporated herein by reference.

The CMP system 100 comprises a polisher 102, a wet robot 104, a cleaner 106, a factory interface module 108, and a plurality of wafer cassettes 110. Robots 158 on the factory interface module 108 are used to transport wafers between the cassettes 110 and the cleaner 106, while a wet robot 104 and a CMP robot transport wafers between the input module and the various polishing stations 112. Typically, the CMP process begins by transporting a wafer to be polished from a cassette 110 to the input module 144. The wafer is then transported by the wet robot 104 to a transfer station 118, and subsequently, by means of a robot interface 116 and a CMP robot 114, to one of the polishing stations 112 for polishing. Once polishing is complete, the polished wafer is moved to the transfer station 118 and delivered back to the input module 144.

A conventional post-CMP cleaning sequence begins with the polished wafer being transported on a "walking beam" 148 in a cleaning section 138 of the cleaner 106. The walking beam 148, which comprises a series of wafer grippers (not shown) connected to a horizontal bar (not shown), transports polished wafers through different cleaning baths in the cleaning section 138. The wafer is washed and scrubbed with cleaning fluids as it moves through the cleaning section 138 on the walking beam 148 towards an end 154 to remove the slurry and other contaminants which have accumulated on the wafer during polishing. At the end of the cleaning sequence, the cleaned wafer is removed from the walking beam 148 by the factory interface robot 158 and placed in one of the cassettes 110.

As illustrated in FIG. 1, the system 100 is also coupled to a controller 180, which controls the system 100 for implementing the treatment method of the present invention. Illustratively, the controller 180 comprises a general purpose computer or a central processing unit (CPU) 182, support circuitry 184, and memories 186 containing associated control software. The controller 180 is responsible for automated control of the numerous steps required for wafer processing—such as wafer transport, wafer polishing, temperature control, wafer cleaning, and so on. Bi-directional communications between the controller 180 and the various components of the system 100 are handled through numerous signal cables collectively referred to as signal buses 188, some of which are illustrated in FIG. 1.

The method of the invention can also be practiced in an apparatus different from that illustrated in FIG. 1, e.g., a cleaning system having different cleaning modules such as a megasonic cleaner, scrubber and spin-rinse-dryer. For example, an electroless deposition may be incorporated as part of the megasonic clean step. Typically, the megasonic bath temperature is maintained at between about 25 and about 100° C. Details of this cleaning system are disclosed in commonly-assigned U.S. provisional patent application Ser. No. 60/131,124, entitled "Semiconductor Substrate Cleaning System," filed on Apr. 27, 1999, which is incorporated herein by reference. In addition, embodiments according to the invention may also be performed in different spin-rinse-dryers, for example, by dispensing an electroless plating solution through a fluid delivery system adapted for rinsing operations. Depending on the desired metal-containing layer, different electroless plating solutions can be used. One example of a spin-rinse-dryer that is suitable for practicing the invention is disclosed in commonly-assigned U.S. patent application Ser. No. 09/350,212, entitled "Edge Bead Removal/Spin Rinse Dry (EBR/SRD) Module," filed on Jul. 9, 1999, which is incorporated herein by reference.

Process

Figure 2:
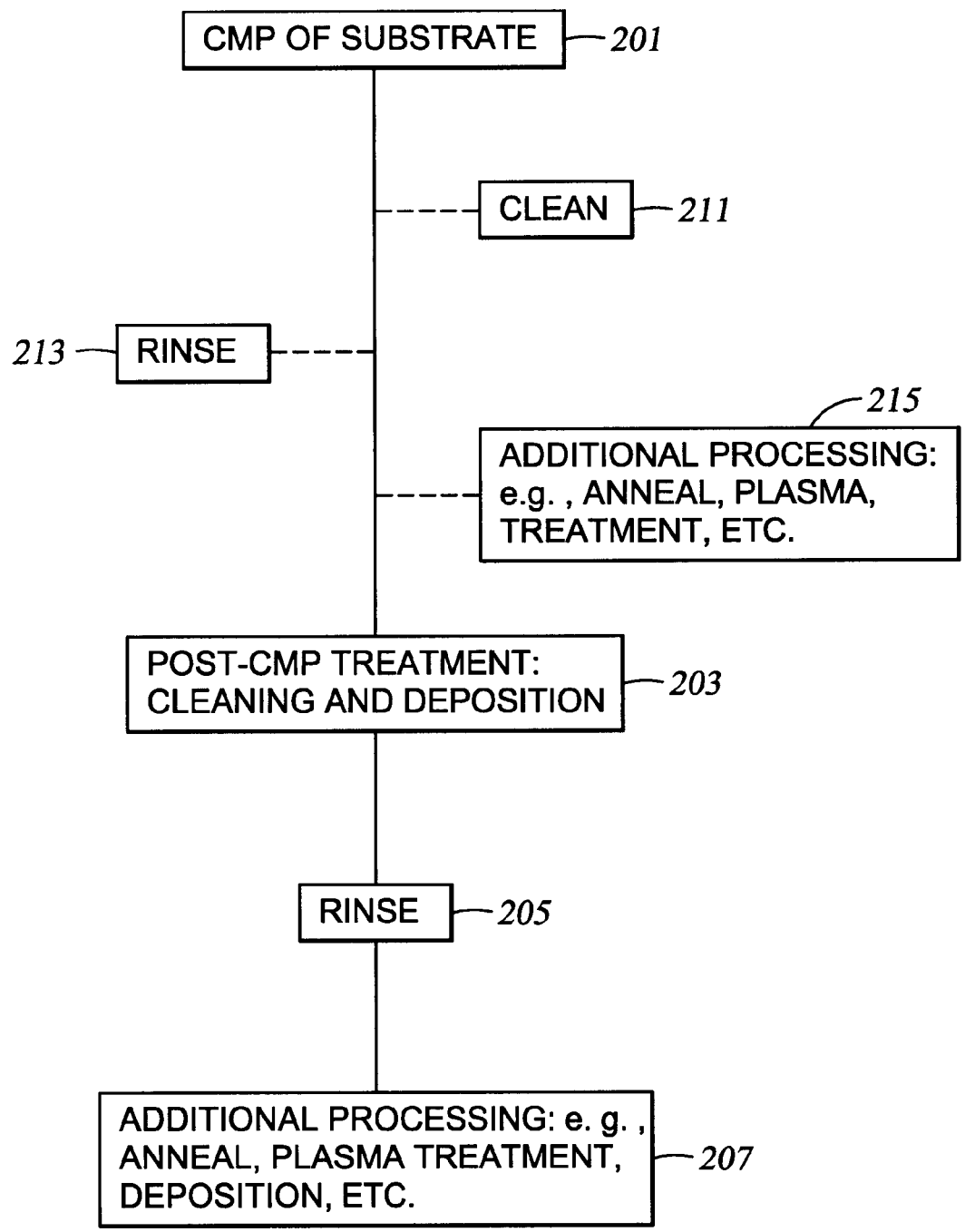
FIG. 2 depicts a flow diagram illustrating chemical mechanical processing incorporating the present invention.

FIG. 2 illustrates a wafer process sequence incorporating a method of the invention. In step 201, a wafer is subjected to CMP to produce a planarized structure. For example, the planarized structure may comprise a copper layer that has been deposited in a contact or via structure. According to one embodiment of the invention, the wafer is then subjected to a post-CMP treatment step 203. The treatment step 203 comprises cleaning the wafer and forming a metal-containing layer on the planarized structure of the polished wafer using an electroless process. The metal-containing layer may serve one or more functions—e.g., as an interface layer to improve adhesion between the copper layer and a subsequently deposited material layer, or as a barrier layer to minimize inter-diffusion between different material layers.

The metal-containing layer may be a single component metal layer, or it may be an alloy (or polyalloy) containing both metal and non-metal components. Examples include nickel, tin, cobalt, or cobalt tungsten phosphorus, among others. Different electroless plating solutions (or electrolytes) may be used for depositing the desired metal-containing layers, using process conditions that are known the art. An electroless plating solution usually comprises a water-soluble salt containing a metal to be deposited, along with other components such as a reducing agent, complexing agent, or stabilizer, among others. Examples of a reducing agent include hypophosphorous acid, water soluble hypophosphites such as sodium or potassium hypophosphite, among others. A complexing agent may include, for example, carboxylic acids such as malic acid, citric acid, or sodium salts of carboxylic acids, and others that are known in the art. In some applications such as electroless nickel plating, a stabilizer such as water-soluble lead salts, e.g., lead acetate, may also be added to the electroless plating solution. For example, nickel and tin may be deposited from their respective sulphate or chloride salts, and many other water-soluble salts containing the desired metallic ions can also be used in the electroless plating solution. Exemplary solutions and conditions for electroless plating nickel and tin may be found, for example, in Uchida et al., U.S. Pat. No. 5,910,340, issued on Jun. 8, 1999, and in Uchida et al., U.S. Pat. No. 5,248,527, issued on Sep. 28, 1993, both of which are incorporated herein by reference.

Furthermore, it is also possible to deposit an alloy containing a co-deposit of different elements by using an electroless solution containing suitable sources of these elements. For example, ternary alloys such as cobalt tungsten phosphorus (CoWP), may provide improved properties compared to other binary alloys. An electroless solution for depositing CoWP may contain, e.g., ammonium tungstenate as a source of tunngsten ions, cobalt chloride as a source of cobalt ions, hypophosphite as a reducing agent and a source of phosphorus ions, citrate as a complexing agent, and other additives such as pH adjuster and surfactant, among others. The deposition of electroless CoWP alloys on copper damascene structures has been disclosed by Lopatin et al., in "Thin Electroless barrier for Copper Films", Proceedings of SPIE, Vol. 3508, pp.65–77 (September 1998), and is incorporated herein by reference.

Depending on the specific metals or alloys to be deposited, the concentrations and compositions of the electroless plating solutions to be used in embodiments of the invention may be adjusted as appropriate, using suitable parameter ranges known in the art. As an illustrative embodiment, nickel may be plated from an acidic nickel sulphate solution using sodium hypophosphite as a reducing agent. The solution may comprise about 87 g/l $NiSO_4.4H_2O$, 24 g/l $Na_2H_2PO_2.H_2O$, 30 g/l $CH_3COONa.3H_2O$, 4.1 g/l $C_3H_4(OH)(COOH)_3.H_2O$, 2 g/l $NaO_2C_3H_4COONa.6H_2O$, and 0.0015 g/l $Pb(CH_3COO)_2.3H_2O$. In the case of tin (Sn) electroless deposition, a solution of a tin salt, thiourea and an acid may be used. Such a solution may comprise, for example, about 45 g/l of thiourea and 5 g/l of stannous chloride, $SnCl_2.2H_2O$, and sulphuric acid. The sulphuric acid concentration may vary between about 1 and about 100 g/l. The use of these solutions for the electroless plating of Ni and Sn on copper surfaces have been disclosed by Lin et al., in "Manufacturing of Cu/Electroless Nickel/Sn-Pb Flip Chip Solder Bumps", IEEE Trans. Adv. Packaging, vol. 22, pp.575–579 (November 1999), and by Sullivan et al., U.S. Pat. No. 2,369,620, issued on Feb. 13, 1945, both of which are incorporated herein by reference. Typically, electroless deposition is performed at room temperature or above.

According to the invention, the formation of the metal-containing layer is integrated with the cleaning process of the substrate or wafer. The electroless plating solution is used during at least a part of the process to rinse the substrate. For example, substrate cleaning can be accomplished by spraying an electroless plating solution onto the copper surface as part of the cleaning sequence practiced in the apparatus 100. Particles or chemicals from the CMP slurry remaining on the substrate surface may be dislodged from the substrate by the spraying force. In another embodiment, the electroless plating solution can serve as a bath for both deposition and ultrasonic or megasonic cleaning. The substrate can be submerged in the electroless plating solution to rinse the substrate. In any case, the electroless plating solution serves a dual purpose—that of substrate cleaning as well as formation of a metal-containing layer.

The invention may be incorporated in different manners within a cleaning sequence, as shown in FIG. 2. For example, the post-CMP treatment step 203 (i.e., integrated cleaning and deposition) may be performed after an initial cleaning of the substrate. An initial cleaning step 211 may include spraying, ultrasonic or megasonic cleaning using a conventional cleaning fluid. As such, the integrated cleaning and deposition step 203 of the invention provides a secondary cleaning function. In this embodiment, a relatively clean copper surface for electroless plating is provided, and a uniform deposition can be achieved. If a cleaning fluid, other than de-ionized water, is used in the initial cleaning step 211, then the substrate is rinsed in step 213 with de-ionized water, in order to avoid possible undesirable reactions or contamination between the cleaning fluid and the plating solution. Alternatively, the substrate may also be cleaned and/or rinsed (sprayed or in ultrasonic or megasonic baths) initially in steps 211 and/or 213 using de-ionized water prior to electroless plating. Depending on the applications, it may be desirable to perform additional processing of the substrate, as shown in step 215, prior to the cleaning and deposition step 203. Such additional processing may, for example, include thermal anneal or plasma treatment of the copper layer or planarized structure on the wafer.

It is also possible that the integrated plating and cleaning step 203 be performed without any initial cleaning or rinsing steps 211 and 213. In this case, an appropriate electroless plating solution also serves as the primary cleaning fluid.

After the post-CMP treatment step 203 of the invention, at least one rinsing step 205 is performed to rinse off any residual electroless plating solution from the substrate surface. This rinsing step 205 may be performed, for example, in a conventional spin-rinse-dryer. Additional processing is then performed on the substrate in step 207. Such processing may include, for example, additional film treatment such as thermal anneal or plasma treatment of the substrate, deposition of a dielectric layer on the treated substrate surface, and so on, that are used in the fabrication of semiconductor devices.

The integrated cleaning and deposition step 203 improves the properties of the copper surface in one or more aspects. Adhesion between the copper and subsequently deposited material layer may be enhanced due to the substrate cleaning and/or the metal-containing layer serving as an interface, adhesion-promoting layer. Furthermore, the metal-containing layer deposited in step 203, e.g., Ni or CoWP, may serve as a barrier layer, thus reducing electromigration of copper or undesirable inter-diffusion between copper and the subsequently deposited layer.

Figure 3A:
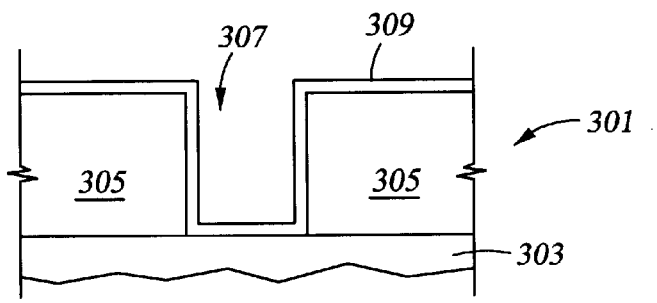
FIGS. 3A–E depicts cross-sectional views of a wafer substrate during various stages of metal processing according to the present invention.

FIGS. 3a–e illustrate cross-sectional views of a wafer 301 at different stages of processing, including the post-CMP treatment according to one embodiment the invention. FIG. 3a shows the wafer 301 comprising, for example, an insulating layer 305 that has been patterned to form a contact or via 307. In general, the underlying layer 303 may comprise silicon, polysilicon, silicides, aluminum, tungsten, or other conducting or semiconducting materials. Typically, a barrier layer 309 is also formed over the insulating layer 305 and inside the contact or via 307. Depending on the specific application, the barrier layer 309 may, for example, be a combination layer comprising a refractory metal and a metal nitride—e.g., titanium and titanium nitride, tantalum and tantalum nitride, or tungsten and its nitride. The barrier layer 309 is used to prevent undesirable diffusion of subsequently deposited metal into the underlying layer 303.

Figure 3B:
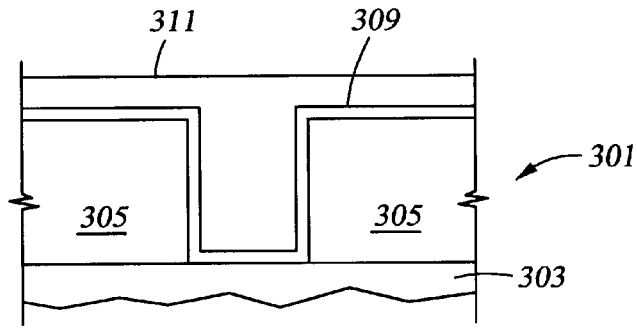
Figure 3C:
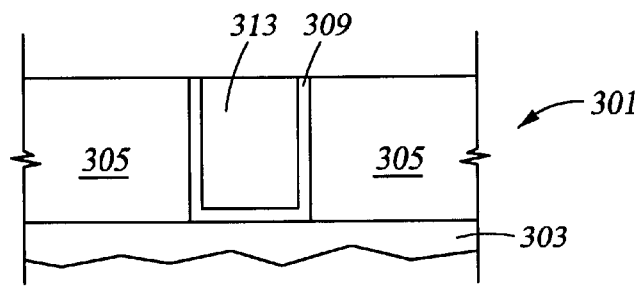

A copper layer 311 is then formed on the barrier layer 309, as shown in FIG. 3b. In general, the copper layer 311 may be formed by either chemical vapor deposition (CVD), physical vapor deposition (PVD) or electroplating methods. If electroplating is used, then a seed layer (not shown) is formed prior to the electroplated copper layer 311 to facilitate electroplating. The copper layer 311 of FIG. 3b is then subjected to planarization using CMP, in which at least a portion of the copper layer 311 is removed, resulting in a planarized structure comprising a polished copper layer 313, as shown in FIG. 3c. This polished copper layer 313 may also be referred to as a copper feature. As previously discussed in connection with FIG. 2, the wafer 301 may be subjected to cleaning, rinsing or other processing steps (not shown in FIG. 3) after CMP.

Figure 3D:
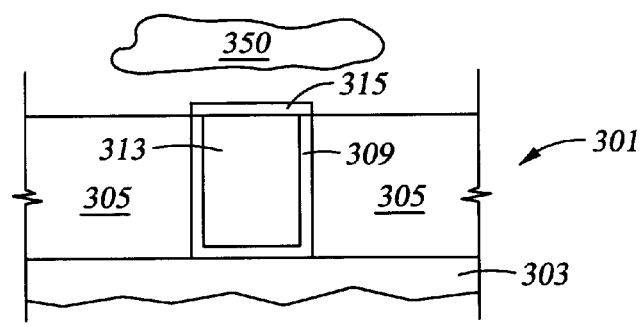

Thereafter, as shown in FIG. 3d, a post-CMP treatment is performed on the wafer 301, in which the wafer 301 is exposed to an electroless plating solution 350, for example, at room temperature. According to embodiments of the invention, a metal-containing layer 315 is deposited on the wafer 301 during the wafer cleaning with the electroless plating solution 350. As previously explained, electroless deposition can be performed by either spraying the electroless plating solution 350 onto the surface of the wafer 301, or by immersing the wafer 301 in a bath containing the electroless plating solution 350. For example, the metal-containing layer 315 may be nickel (Ni), tin (Sn), cobalt (Co), or alloys comprising different elements, e.g., cobalt tungsten phosphorus (CoWP). As previously discussed, Ni and Sn may be deposited from solutions comprising the respective sulphate or chloride salts. Many other salts that are known in the art may also be used. For example, Ronamerse 407—a plating solution available from LeaRonal of New York, is also suitable for depositing Sn on copper features. Electroless deposition can be achieved in less than about 30 seconds at room temperature by immersing a wafer containing copper features in a bath containing the Ronamerse 407 solution at about 50% dilution with water. The deposited Sn layer can promote adhesion with a subsequently deposited layer such as an oxide layer. When the metal-containing layer 315 is Ni or CoWP, then the metal-containing layer 315 can act as both an adhesion layer and a barrier layer.

According to one aspect of the invention, the clean copper surface acts as a catalyst for electroless deposition. By using an appropriate reducing agent in the electroless plating solution (e.g., one in which copper can catalyze a reduction reaction involving the reducing agent), the metal-containing layer 315 can be formed selectively on one or more copper features 313 of the wafer 301. For example, a hypophosphite is a suitable reducing agent for use in electroless Ni deposition. Furthermore, depending on the material used for the barrier layer 309, it is also possible to have electroless deposition on the barrier layer 309. As such, the metal-containing layer 315 is not formed on the insulating layer 305 that has been exposed after the completion of CMP. Depending on the specific application and process needs, the deposition time may be adjusted to produce a metal-containing layer 315 having any desired thickness. Typically, the metal-containing layer 315 is deposited to a thickness of less than about 1000 Å, preferably between about 50 and about 100 Å. In general, a relatively thin metal-containing layer 315 is preferred in order to avoid any excessive current passing through this metal-containing layer 315 during device operation. It is important, however, that the metal-containing layer 315 be formed as a continuous layer. Typically, a deposition time of less than about 30 seconds, or a few seconds, is sufficient to provide a continuous metal-containing layer 315. Depending on the desired thickness or process throughput, the deposition time can be adjusted accordingly. For example, a deposition time of about 5 minutes may be used without significant impact on the process throughput.

Figure 3E:
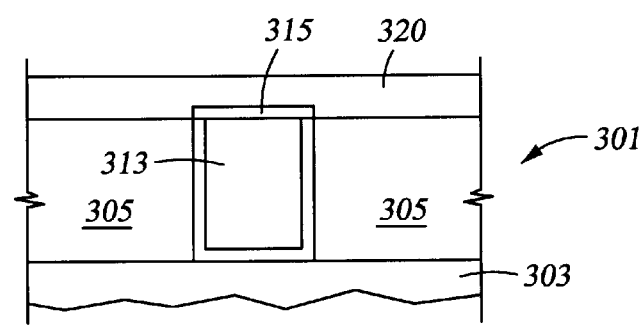

After the formation of the metal-containing layer 315 during the integrated cleaning/deposition treatment, processing continues for the wafer 301, e.g., with the deposition of an insulating layer 320, as shown in FIG. 3e. Depending on the specific properties of the metal-containing layer 305, the resulting structure may have improved properties such as reduced electromigration of the copper layer 313, or enhanced adhesion of the insulating layer 320. Although the post-CMP treatment has been used as one illustrative embodiment of the invention, the integrated cleaning/deposition can generally be applied to other stages of a processing sequence involving a variety of substrates and metal-containing layers that can be formed by electroless processes.

Although several preferred embodiments which incorporate the teachings of the present invention have been shown and described in detail, those skilled in the art can readily devise many other varied embodiments that still incorporate these teachings.

What is claimed is:

1. A method for processing a substrate surface, comprising:

planarizing a substrate surface comprising a conductive material; and forming a metal-containing layer on the substrate surface during substrate cleaning with a cleaning composition comprising an electroless plating solution, wherein forming the metal-containing layer comprises spraying the substrate surface with the cleaning composition to dislodge particles or chemicals remaining from the planarizing the substrate surface.

2. The method of claim 1, wherein the planarizing a substrate surface forms a non-conductive surface comprising conductive features and the metal-containing layer selectively forms on the conductive features.

3. The method of claim 2, wherein the conductive features comprise copper.

4. The method of claim 2, wherein the metal-containing layer is formed by an electroless process.

5. The method of claim 1, wherein the substrate surface is subjected to a cleaning process prior to forming the metal-containing layer on the substrate surface.

6. The method of claim 1, wherein the substrate surface is rinsed with de-ionized water prior to forming the metal-containing layer on the substrate surface.

7. The method of claim 1, wherein the metal-containing layer is selected from the group of nickel, tin, cobalt, cobalt tungsten phosphorus, and combinations thereof.

8. The method of claim 1, wherein the electroless plating solution comprises a salt selected from the group of nickel sulphate and tin chloride.

9. The method of claim 1, wherein the method steps for processing a substrate surface comprise a series of instructions disposed in a computer-readable medium adapted to implement instructions for processing the substrate by a chemical mechanical (CMP) system and cleaning apparatus when said instructions are arranged and executed by one or more processors connected to the chemical mechanical (CMP) system and cleaning apparatus.

10. A method of metal processing, comprising:

forming a first metal-containing layer on a substrate;

forming a planarized structure on the substrate by subjecting the first metal-containing layer to chemical mechanical polishing; and forming a second metal-containing layer on the substrate during substrate cleaning with a cleaning composition comprises an electroless plating solution, wherein forming the second metal-containing layer comprises spraying the substrate with the cleaning composition to dislodge particles or chemicals remaining from the chemical mechanical polishing.

11. The method of claim 10, wherein the forming a planarized structure on the substrate forms a non-conductive surface comprising conductive features and the metal-containing layer selectively forms on the conductive features.

12. The method of claim 11, wherein the second metal-containing layer is formed by an electroless process.

13. The method of claim 11, wherein the conductive features comprise copper.

14. The method of claim 10, wherein.the second metal-containing layer is selected from the group of nickel, tin, cobalt, cobalt tungsten phosphorus, and combinations thereof.

15. The method of claim 10, wherein the second metal-containing layer is a barrier layer.

16. The method of claim 10, wherein the planarized structure formed by the chemical mechanical polishing is subjected to a cleaning process prior to forming the second metal-containing layer on the substrate.

17. The method of claim 16, wherein the cleaning process comprises exposing the planarized structure to de-ionized water.

* * * * *